(12) United States Patent
Blanchet-Fincher et al.

(10) Patent No.: US 7,351,357 B2
(45) Date of Patent: Apr. 1, 2008

(54) PRINTING OF ORGANIC CONDUCTIVE POLYMERS CONTAINING ADDITIVES

(75) Inventors: Graciela Beatriz Blanchet-Fincher, Greenville, DE (US); Feng Gao, Wilmington, DE (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/374,875

(22) Filed: Feb. 26, 2003

(65) Prior Publication Data

US 2004/0021131 A1   Feb. 5, 2004

Related U.S. Application Data

(60) Provisional application No. 60/360,999, filed on Mar. 1, 2002.

(51) Int. Cl.
*H01B 1/04* (2006.01)
*H01B 1/12* (2006.01)
*B05D 5/12* (2006.01)

(52) U.S. Cl. .................... 252/500; 252/510; 427/96.1; 427/122

(58) Field of Classification Search ............... 252/500, 252/502, 510, 511; 423/445 R; 427/96.1, 427/122
See application file for complete search history.

(56) References Cited

U.S. PATENT DOCUMENTS

| | | | |
|---|---|---|---|
| 5,217,649 A | * | 6/1993 | Kulkarni et al. ............ 252/500 |
| 5,320,780 A | | 6/1994 | Unruh |
| 5,403,873 A | | 4/1995 | Nakamura et al. |
| 5,585,040 A | * | 12/1996 | Kirmanen et al. ...... 252/519.33 |
| 5,595,689 A | * | 1/1997 | Kulkarni et al. ............ 252/500 |
| 5,783,111 A | * | 7/1998 | Ikkala et al. ................ 252/500 |
| 5,866,043 A | * | 2/1999 | Ikkala et al. ................ 252/500 |
| 5,932,643 A | | 8/1999 | Kenny |
| 6,114,088 A | | 9/2000 | Wolk et al. |
| 6,140,009 A | | 10/2000 | Wolk et al. |
| 6,194,119 B1 | | 2/2001 | Wolk et al. |
| 6,205,016 B1 | | 3/2001 | Niu |
| 6,214,520 B1 | | 4/2001 | Wolk et al. |
| 6,270,944 B1 | | 8/2001 | Wolk et al. |
| 6,284,425 B1 | | 9/2001 | Staral et al. |
| 6,291,116 B1 | | 9/2001 | Wolk et al. |
| 6,291,126 B2 | | 9/2001 | Wolk et al. |
| 6,703,163 B2 | * | 3/2004 | Ogura et al. ............. 429/218.1 |
| 7,033,525 B2 | * | 4/2006 | Blanchet-Fincher ........ 252/502 |

FOREIGN PATENT DOCUMENTS

EP   0 545 729   6/1993

(Continued)

OTHER PUBLICATIONS

Ikkala et al "Phase Behavior of polyaniline/dodecyl benzene sulfonic acid mixtures", Synthetic Metals 69 (1995) 135-136.*

(Continued)

*Primary Examiner*—Mark Kopec

(57) ABSTRACT

Additives to organic conducting polymers are described which enhance adhesion and resolution of printed films while retaining adequate electrical conductivity. The conductive polymer films are useful in printing conductive portions of thin film transistors such as sources and drains. Additives include surfactants, second macromolecules, plasticizers, and excess sulfonic acids.

10 Claims, 8 Drawing Sheets

FOREIGN PATENT DOCUMENTS

| | | |
|---|---|---|
| EP | 1 052 654 | 11/2000 |
| GB | 2 360 524 | 9/2001 |
| JP | 5-187825 | 7/1993 |
| JP | 05198925 | 8/1993 |
| WO | WO/9527289 | 10/1995 |
| WO | WO 98/05040 | 2/1998 |
| WO | WO/9918621 | 4/1999 |

OTHER PUBLICATIONS

Kay Hyeok An et al "High capacitance supercapacitors using single walled carbon nanotube and polypyrrole hybrid electrodes", Proc. 6th App. Diamond Conf. NASA Aug. 6, 2001. 675-680.*

Deng et al "Hybrid composite of polyaniline containing carbon nanotube", Chinese Chem. Lett, vol. 12, No. 11, pp. 1037-1040. 2001.*

Lenfeld et al "High-Performance Contacts in Plastics Transistors and Logic Gates That Use Printed Electrodes . . . ", Advanced Materials, 15, No. 14, Jul. 2003 (1188-1191).*

Kuramoto, et al., "Preparation and Processable Polyaniline Doped and Complexed with Anionic Surfactant", Polymers for Advanced Technologies, Sep. 5, 1997, pp. 222-226, vol. 9, Japan.

* cited by examiner

- ■ L5000 (Control)
- □ Example 8
- ◇ Example 9
- × Example 10
- + Example 11

- ○ L5000 (Control)
- + Example 12
- × Example 13
- △ Example 14
- ◆ Example 15
- ■ Example 16
- ● Example 17

- ■ L5000 (Control)
- □ Example 18
- ◇ Example 19

- ■ Example 20
- □ Example 21

- ■ Example 28
- □ Example 29
- ◇ Example 30
- × Example 31
- + Example 32
- △ Example 33

PRINTING OF ORGANIC CONDUCTIVE POLYMERS CONTAINING ADDITIVES

FIELD OF THE INVENTION

The present invention relates to the printing of films of electrically conductive organic polymers, particularly polyaniline, with additives to enhance the adhesion and resolution of the printed film while retaining adequate electrical conductivity. The conductive polymer films are useful in printing conductive electrical devices, particularly portions of thin film transistors known as sources and drains.

TECHNICAL BACKGROUND

Niu (U.S. Pat. No. 6,205,016) describes composite electrodes including carbon nanofibers and an electrochemically active material for use in electrochemical capacitors.

Kenny (U.S. Pat. No. 5,932,643) describes coating formulations for printed images which contain conductive polymers.

Baude et al (U.S. Pat. No. 6,194,119 B1) describe selective thermal transfer of a first material proximate to a second material on a receptor from a first donor element.

Wolk et al (U.S. Pat. No. 6,291,116) disclose thermal transfer elements and processes for patterning solvent-coated layers and solvent-susceptible layers onto the same receptor substrate.

Higashama (JP 05198925) disclose integrated circuit manufacture by contacting a thermoplastic film with a circuit substrate and the selective thermal transfer of the material onto the substrate.

Staral et al (U.S. Pat. No. 6,284,425) disclose a thermal transfer donor element that includes a substrate, a transfer layer, a light-to-heat conversion layer and an underlayer.

Wolk et al (U.S. Pat. No. 6,270,944) disclose a thermal transfer element for forming a multilayer device.

Wolk et al (U.S. Pat. No. 6,291,126) disclose thermal transfer elements and processes for patterning organic materials for electronic devices onto patterned substrates.

Wolk et al (U.S. Pat. Nos. 6,214,520, 6,140,009, 6,114,088) disclose a thermal transfer element for forming a multilayer device.

SUMMARY OF THE INVENTION

The present invention describes a composition comprising:
a) An organic conducting polymer selected from the group consisting of polyaniline, polythiophene, polypyrrole, and their derivatives, and poly(heteraromic vinylenes), doped with an organic protonic acid with 1 to 30 carbons, such that there are between 0.3 and 2.0 acid molecules for each nitrogen or sulfur in the polymer backbone, said polymer optionally doped with excess organic protonic acid with 1 to 30 carbons such that there are between 0.15 and 1 molecules of the excess organic protonic acid for each nitrogen or sulfur in the polymer; and
b) plasticizer at a concentration of between 0.01 and 40% by weight.

In a preferred embodiment the plasticizer is at a concentration of between 5 and 20% by weight.

The present invention also describes the above compositions further comprising 0.1 to 20% by weight, preferably 0.5 to 10% by weight, of highly acicular conductors. The highly acicular conductors are preferably carbon nanotubes, which may be single walled carbon nanotubes or multi-wall carbon nanotubes. The highly acicular conductors may be arc grown, laser grown or high pressure carbon-monoxide grown carbon nanotubes.

In another embodiment of the present invention the compositions described above further comprise 0.001 to 1% by weight of a surfactant.

The compositions described above may further comprise 1 to 30% by weight of a second macromolecule.

The compositions described may be used in an image transfer or printing process. The image transfer or printing process may be selected from the group consisting of laser transfer printing, ink jet printing, microcontact printing, offset printing and a gravure process.

The present invention may be used in electronic devices comprising a patterned conductor comprised of the composition described above. The electronic device described may be selected from the group consisting of an interconnect, a via, a transistor, a source and drain electrode pair, a gate electrode, a backplate, an inductor, a capacitor, and a resistor.

DETAILED DESCRIPTION

Figure 1:
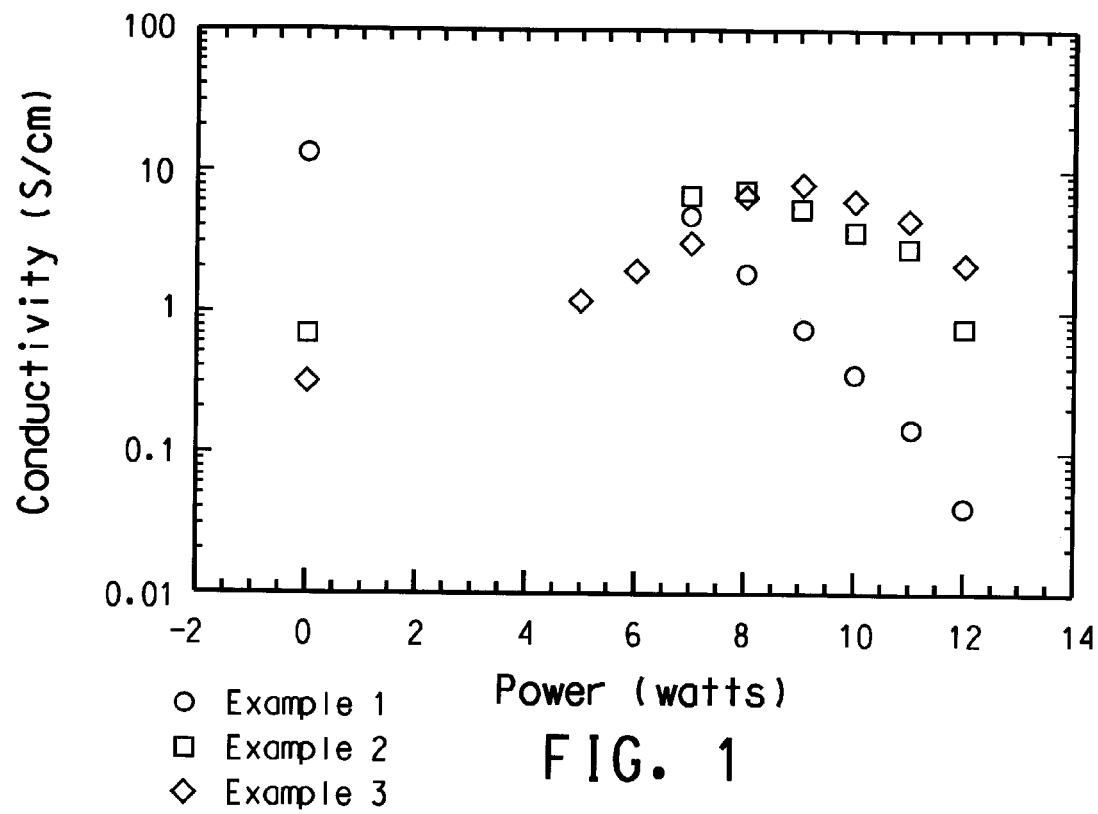
FIG. 1 shows the conductivity (S/cm) as a function of laser power (Watts).

This invention discloses additives to organic conducting polymers, preferably polyaniline (PANI), for applications in which a resulting conducting layer must be thermally imaged with high resolution. The processability, adhesion, resolution and conductivity of the organic conducting polymer used in the examples is tuned with either a specific acid, such that the properties and imaging characteristic of the pattern generated via thermal imaging techniques, such as laser printing, is increased while the conductivity retained. Alternatively, the adhesion and image integrity can be tuned by introducing binders and plasticizers in such ratios that sufficient conductivity is retained. Improved conductivity is also achieved through the addition of conductive media such as carbon nanotubes with high aspect ratios and metal-like conductivity. Since the nanotube concentration is considerably lower than that required of fillers, the processability of the host polymer is maintained while the conductivity is increased without the need for incorporating a high boiling solvent.

Organic conductors such as polyacetylene, which have a π-electron system in their backbone or like poly-(p-phenylene), and polypyrole consist of a sequence of aromatic rings and are excellent insulators in their native states and can be transformed into complexes with metallic conductivity upon oxidation or reduction. In particular, the electrical conductivity of polyacetylene $(CH)_x$ increases by a factor of $10^{11}$ when the polymer is doped with donor or acceptor molecules. Over the last 30 years there has been considerable interest in developing polymers with conductive rather than insulating properties such that they could be used in active electronic devices.

Tailoring electrical properties of polymers has been achieved utilizing three different strategies:

1) Modifying the intrinsic bulk properties by altering the chemical composition and structure of the starting material.
2) Altering the properties of the polymer at the molecular level by incorporating dopants, which may form charge transfer complexes with the host polymer.
3) Incorporating microscopic pieces such as carbon nanotubes, metal flakes, carbon-black particulate into the host polymer to form a conducting percolating conducting network in the host polymer.

Although, the second route clearly provides the most efficient pathways to polymeric synthetic metals, materials tend to exhibit lack of stability under ambient conditions. In the case of polyacetylene, poly(1,6-heptadiyne) and polypropyne, the un-doped polymers are unstable in oxygen. Although poly-p-phenylene, poly-p-phenylene oxide and poly-p-phenylene sulfide are stable in oxygen, they can only be doped with powerful acceptors such as $AsF_5$ and once doped they are susceptible to rapid hydrolysis under ambient conditions. Although polypyrole is stable under ambient conditions, it lacks some of the other desirable characteristics, most notably variable conductivity.

Alternatively, more modest conductivity values (0.001 S/cm) can be achieved by filling inert polymers with conductors. Conductivities of $10^{-10}$ to $10^{-1}$ S/cm are readily achieved and can be tailored into the specifications. The electrical conductivity depends upon filler loading and there is a steep dependence upon filler load over a short range above a critical level (percolation threshold). Since high levels of filler loading, 10-40%, are employed to achieve high conductivities, polymer process ability is severely hindered. Typical fillers are PAN-derived C fibers, metallized glass fibers, Al flakes, and carbon black. Typical loading and resulting conductivities are shown in Table 1.

TABLE 1

| Composite | Conductivity (S/cm) |
| --- | --- |
| Polycarbonate (PC) | $10^{-16}$ |
| PC + 20% Al flake | $10^{-15}$ |
| PC + 30% Al flake | 1 |
| PC + 10% PAN carbon fiber | $10^{-8}$ |
| PC + 40% PAN C fibers | $10^{-2}$ |
| Nylon 6,6 (N-6,6) | $10^{-14}$ |
| N-6,6 + 40% pitch C fiber | $10^{-4}$ |
| N-6,6 + 40% PAN C fiber | 1 |

In contrast, typical synthetic metals such as polyacetylene, polyphenylene, and polyphenylene sulfide, can exhibit conductivities ranging from $10^2$-$10^3$ s/cm in the metallic regime. However, since these values are obtained via strong oxidizing or reducing reaction materials, they tend to be not stable at ambient conditions limiting practical applications.

The search for environmentally stable synthetic metals led to considerable effort in polyaniline (PANI). Although these materials have lower conductivity in the metallic state they appear to also have significant π de-localization in the polymer backbone but unlike other conducting polymers they are stable in air indefinitely. In particular, the emeraldine base form of polyaniline can be doped to the metallic conducting regime by dilute non-oxidizing aqueous acids such as HCl to yield an emeraldine salt that exhibits metallic conductivity but is air stable and inexpensive to produce in large quantities. The emeraldine form of polyaniline is believed to show high conductivity because of the extensive conjugation of the backbone. Unlike all other conjugated polymers, the conductivity of the material depends on two variables rather than one, namely the degree of oxidation of the PANI and the degree of protonation. However, most polyanilines have $10^2$-$10^6$ lower conductivity than polyacetylene. The highest conductivity PANI's are those cast from solutions of PANI camphosulfonate (PANI-CSA) in m-cresol. Conductivities of approximately $4 \times 10^2$ S/cm are observed. This is about two order of magnitude higher than PANI's protonated with mineral acids, which range from $10^{-1}$ to $10^1$ S/cm. Although PANI-CSA has sufficiently high conductivity, the use of m-cresol with a boiling point of 203° severely limits its use in plastic electronics where substrates, such as Mylar®, are not stable at such elevated temperatures.

Achieving stable polymeric materials with metallic conductivities that are processable and stable at ambient conditions is important for the use of conducting polymers in electronic applications. During the past decade, there has been a growing interest in developing thin film field effect transistors (TFT) using inexpensive and easily processable organic materials. In principle, organic materials have greater flexibility and easier tunability relative to the silicon based counterparts. Considerable activity has been focused on the development of semiconductor materials with high mobilities for applications in TFT's due to vast variety of organic materials available. Poly(alkylthiophenes), oligothiophenes, pentacene, phthalocyanines are just a few examples of such semiconductors. However, the conducting layer in such devices has typically utilized metals.

The use of PANI's in organic electronics requires the ability to pattern the material with high resolution. If the organic conductor is to be used as the source and drain in plastic transistors it requires imaging the source and drain conducting lines ranging from 1 to 1000, preferably 5 to 100 microns in width with a separation between source and drain lines of 0.5-100 microns, preferably 1-20 microns. Patterning of the conducting layer through a laser thermal transfer process will be described in detail for such applications. If imaging is performed via a transfer technique such as thermal imaging, the resolution of the image lines as well as device performance is controlled by the adhesion of the transfer film onto either a dielectric or a semiconducting layer. In addition, the conductivity of the organic conducting film must be preserved throughout the imaging process. This invention shows that the formulation of organic conductors suitable for high-resolution imaging can be achieved by tuning the adhesion of the transfer organic conducting layer on to the receiver layer. In addition, formulations must be tailored such that the heat absorbed during transfer does not decompose the conductor, degrading its conductivity. Maintaining the conductivity of a PANI layer upon thermal transfer is challenging since the heat induced by the laser partially deprotonates the backbone partially driving the polymer into the non-conducting emeraldine form.

Using the present invention, organic conductors can be imaged with high resolution using thermal transfer methods. In particular, specific acids and additives have been identified, which would lead to PANI's that can be imaged using thermal transferring techniques with high resolution and good adhesion to the underlying layer while either maintaining or increasing the conductivity of the transferred layer. The materials disclosed here are appropriate for applications as gates, sources, drains and interconnects in plastic TFT transistors in microelectronics. Conductor patterns including source and drain electrodes or gates and their associated interconnects are referred to as backplanes prior to deposition of semiconductor material. The present invention can be used to fabricate backplanes.

One of skill in the art will also recognize that the present invention can be used to make other circuit elements using conductors. These elements include interconnects, vias, inductors, capacitors, and resistors. For an inductor, a loop of conductor is deposited, followed by a layer of electrical insulation. A second loop is then deposited over the insulation. For a capacitor, a first layer (plate) of conductor is deposited. This is followed by deposition of a layer of dielectric. Finally, a second layer of conductor (plate) is deposited on the dielectric. A resistor is merely of strip of conductor of appropriate length and resistivity to produce a desired resistance.

Definitions

By protonic acid is meant an acid molecule containing a proton that dissociates from a counter ion in a solvent.

By carbon nanotubes herein is meant carbon atoms bonded together in a hexagonal pattern to form long cylinders. Carbon nanotubes can be either single wall or multi-wall. Single wall carbon nanotubes are described in U.S. Pat. No. 5,424,054 to Bethune. Multi-wall carbon nanotubes are described in U.S. Pat. No. 5,747,161. Carbon nanotubes can be arc grown, laser grown or grown in high pressure carbon monoxide. The nanotubes used herein were obtained from Rice University, Houston, Tex., U.S.A.

By organic conducting polymers are meant polyaniline, polythiophene, polypyrrole, and their derivatives, and poly (heteraromic vinylenes). Polyaniline and polythiophene are preferred. Polyaniline is most preferred.

Acid plasticizers are added to organic conducting polymers to increase the flexibility and adhesion of the deposited films. Plasticizers may be, but are not limited to, alkyl or aryl sulfonic acid, alkyl or aryl phosphoric acid and alkyl or aryl carboxylic acid. Esters of the acids are also used as plasticizers. Preferred plasticizers are alkyl or aryl sulfonic acids including, but not limited to, dinonylnaphthalene sulfonic acid, dodecylbenzene sulfonic acid, dibutylnaphthalene sulfonic acid, camphor sulfonic acid, toluene sulfonic acid, and methane sulfonic acid. Dinonylnaphthalene sulfonic acid is most preferred.

Surfactants are added to organic conducting polymer/carbon nanotube dispersions to aid in dispersion of the nanotubes. Surfactants may be, but are not limited to, ZONYL FSO, ZONYL FSN, ZONYL FS-300 and ZONYL FSA (DuPont, Wilmington, Del.) and TRITON-100, TRITON x-114, and IGEPAL CO-520 (Aldrich).

Second macromolecules must be soluble in the same solvent used for dissolution of the organic conducting polymer and must be miscible with the doped organic conducting poymer. These include, but are not limited to, ELVALOY HP 771, ELVALOY HP 441, ELVALOY HP 662 and ELVALOY 4924 (DuPont, Wilmington, Del.), CHLOROWAX 50 (Occidental Chemical Corporation, Dallas, Tex.), polysytrene, polyester, poly(styrene-methyl methacrylate), and polyacrylate.

Preferred solvents herein are selected from the group consisting of xylenes, toluene, cyclohexane, chloroform, or mixture thereof with polar solvent such as isopropanol, 2-butoxyethanol, where the content of the polar solvent is preferably less than 25% by weight.

Description of Experimental Setup

The imaged source and drains in the following examples were obtained using a CREO 3244 Trendsetter exposure unit (Creo Inc. Vancouver, Canada). The system comprises an 81.2-cm long drum of 91-cm perimeter. In one configuration, the 15 cm×20 cm receiver was taped on to an Al offset plate (71.1 cm×94.5 cm) at its lower right hand corner. The donor film tightly placed directly on top of the receiver with the emulsion towards the receiver. The offset plate was auto-loaded on to the trendsetter drum and magnetically clamped in position. In an alternative configuration the donor and the receiver were placed in the cassette and automatically loaded onto the drum. The donor film was written with an array of 240 5×2 micron spots resulting from the splitting of a 20 watt maximum average power infrared diode lasers beam emitting at 830 nm at 1 microseconds pulse width. The drum speed varied to achieve sensitivities of 200 to 550 mJ/cm2. The donor films used in the following examples comprised 3 layers: 1) a 4 mil Mylar substrate coated with 2) a thin metal layer heating layer which, in turn, is coated with 3) a solution of the conducting PANI and various additives on top.

EXAMPLES 1-3

These examples illustrate the effect of added excess acid on the conductivity of a transfer polyaniline layer. The images were obtained using a CREO trendsetter with 5080 DPI (CREO-Scitex, Vancouver, Canada). A Spectrum Trendsetter Exposure Unit, available from Creo Inc. (Vancouver, Canada) exposed the donor elements. The laser average power ranged from 4 to 12 Watts and the drum speed from 100 to 200 RPM. The 0.5 cm by 5 cm solid areas transferred at these laser powers were fabricated using a donor film comprising a 100 Å layer of Ni coated via electron beam deposition by Flex, Inc (Santa Rosa, Calif.) directly on 400D Mylar to about 40% optical transmission. The layer to be transferred was a 1.3-micron film of L5000 (Ormecon Chemie GmbH and Co. KG, Ammersbek, Germany) PANI coated on to the Ni base. The L5000 solution contains 8.5% solids in equal part of isopropanol and toluene. The L5000 is doped to exhibit high electrical conductivity in the as purchased condition. The manufacture does not disclose the dopant used although it is believed to be p-toluene sulfonic acid. The solution was coated using Meyer rod #6 onto a 15 cm by 20 cm base. Example 1 used the L5000 solution without additives. In Examples 2 and 3, the PANI layer contains 50% and 100% excess di nonyl naphthalene sulfonic acid, hereafter referred to as DNNSA. DNNSA is added to the L5000 solution prior to coating on the donor. An excess of 50% implies there are 0.25 moles of sulfur atoms from the excess acid dopant added for each mole of nitrogen in the polyaniline. An excess of 100% implies there are 0.5 moles of sulfur atoms added in the acid dopant for each mole of nitrogen atoms in the polyaniline. Additionally, between 005-0.05 (weight %) of Zonyl® surfactant, obtained from E. I. du Pont de Nemours and Company, Wilmington, Del., was added to the solution. The receiver comprised a 1 micron acrylic latex (55MMA/40BA/3MAA/2GMA where MMA is methyl methacrylate, BA is butyl acryl ate, MAA is methyl methacrylic acid and GMA is glycidyl methacrylate)) coated on to 400D Mylar using a CV® Coater from DuPont, Wilmington, Del., equipped with a #6 Meyer rod. The coating was dried for 3 minutes at a temperature of 50° C. The 15 cm×20 cm receiver layer was placed at the bottom right hand corner of a 74.5 cm×91.1 cm aluminum offset plate. The donor film, with the PANI surface facing the receiver coating, was stretched directly on top of the receiver. The Al offset plate was automatically loaded and positioned using magnetic clamps. To form the patterned image, the laser beam is focused on to the metal interface. The heat generated begins the decomposition of the organics in the adjacent interfaces, which leads to the transfer of the PANI onto the receiver at the different laser powers. After the exposure is completed, the image on the receiver consists of nine 0.5 cm×5 cm solid stripes transferred at laser powers ranging from 4 to 12 Watts.

The conductivity of each of the transfer solid stripes was measured using 4-probe method. Thicknesses were determined by a Dektak profilometer. After the film thickness was measured, Ag contacts were sputtered to a thickness of 4000 Å through an aluminum mask using a Denton vacuum unit (Denton Inc. Cherry Hill, N.J.). The film resistivity was measured using the standard 4-probe measurement technique. The current was measured at the two outer contacts. These contacts were separated by 1" and connected to a Hewlett Packard power supply in series with an electrometer (Keithley, 617). The voltage was measured at the two inner contacts, separated 0.25" using a Keithley multimeter. The resistivity (in ohm-square) as a function of laser power is shown in FIG. 1. The resistivity was calculated as:

$$R = VL/iwt$$

where R is the resistivity, V is the voltage measured at the inner contact, i is the current through the outer contacts, L is the separation between the inner contacts, w is the width of the film and t is the film thickness. The film conductivity, S, is 1/R.

As shown in FIG. 1, the conductivity of the L5000 without excess acid rapidly decreases with increasing laser power. The transferred films without excess acid show extremely low adhesion making it inappropriate for electronic applications. Adhesion was measured by inspection. Poorly adherent transferred layers may not remain on the receiver element after separation of the donor from the receiver after laser exposure. Alternatively, poorly adherent transferred layers may exhibit peeling around the edges. Poorly resolved transferred layers exhibit very irregular edges due to partial detachment. As excess acid is increased (Examples 2 and 3), the film becomes effectively more plasticized so that the adhesion of the transferred layer to the receiver layer is considerably improved. As shown in FIG. 1, PANI with excess acid as an additive transferred in the 6-8 Watts range shows adequate conductivity as well as improved adhesion. Both set levels of excess acid are adequate for electronic applications.

EXAMPLES 4-7

Examples 4 to 7 illustrate the use of excess dodecyl benzene sulfonic acid (DBSA) in L5000 Ormecon PANI to retain electronical conductivity while improving the adhesion of a thermally transferred layer on to a receiver. The procedure for obtaining the donor layer is as previously described in Examples 1-3 with DBSA substituted for DNNSA. The receiver layer, mounting procedure, imaging procedure and conductivity measurements were also as previously described for Examples 1-3.

Figure 2:
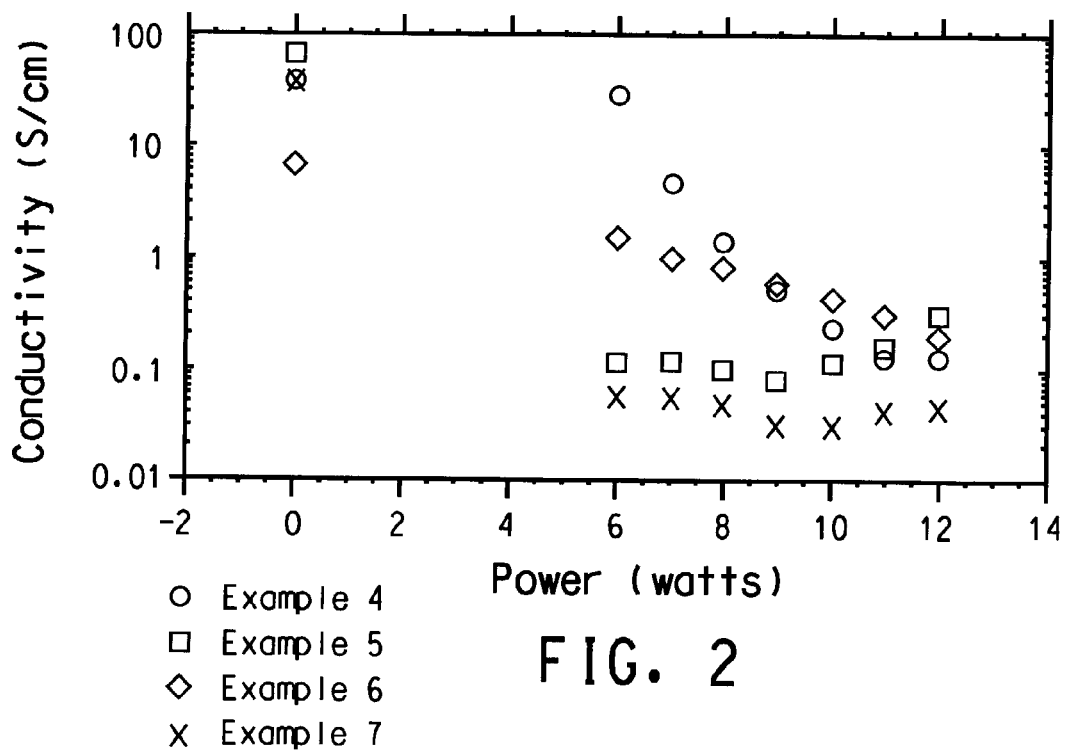
FIG. 2 shows conductivity (S/cm) as a function of laser power (Watts). Excess DBSA reduces the film conductivity.

As shown in FIG. 2, excess DBSA generally reduces the film conductivity. Adhesion is improved since the excess acid plasticize the film. Films with 33% excess acid transferred in the 6-8 Watts regime show improved adhesion and appropriate conductivity. As in Examples 1-3, adhesion was determined by inspection of the transferred layer.

EXAMPLES 8-11

These examples illustrate the effect of added plasticizer and low $T_g$ (glass transition temperature) organic material as second macromolecules on the adhesion and conductivity of a transferred polyaniline layer. Plasticizers are materials which when mixed with polyaniline interact with the polyaniline backbone to reduce the mechanical strength of the resulting material. The softer material with plasticizers exhibit enhanced adhesion upon thermal transfer. Appropriate plasticizers should be soluble in the organic solvent used to dissolve the polyaniline. Appropriate solvent include xylenes, toluene, cyclohexane, chloroform, isopropanol, and 2-butoxyethanol. Examples of appropriate plasticizers are alkyl or aryl esters, alkyl or aryl phosphates, and alkyl or aryl sulfonamides. Second macromolecules are waxes or polymers which raise the average decomposition temperature of their mixture with polyaniline. A transfer layer containing polyaniline is subject to heat during the thermal transfer process. Addition of a high decomposition temperature material to the polyaniline serves to absorb some of the heat generated during the transfer process, thus protecting the polyaniline from decomposition. Appropriate second macromolecules should be soluble in the organic solvent used to dissolve the polyaniline. Examples of appropriate second macromolecules are polyacrylate, polystyrene, ployester, polystyrene methyl methacrylate, co-polymers of ethylene/n-butyl acrylate/carbon monoxide such as Elvaloy HP441®, and chlorinated paraffin such as Chlorowax 50®. The low glass transition material is Chlorowax 50 hereafter referred to as CW50 (Occidental Chemical Corporation, Dallas, Tex.). The plasticizer is di-phenyl phthalate (dPP) (Aldrich, Milwaukee, Wis.). The procedure for obtaining the donor layer is as previously described in Examples 1-3 with excess DNNSA addition omitted. Instead CW50 or CW50 and dPP were added to the L5000 solution as described in Table 2. The receiver layer, mounting procedure, imaging procedure and conductivity measurements were also as previously described for Examples 1-3.

TABLE 2

|  | Control | Ex. 8 | Ex. 9 | Ex. 10 | Ex. 11 |
| --- | --- | --- | --- | --- | --- |
| L5000 (8.5%) | 50 gr. | 45 gr. | 40 gr. | 35 gr. | 40 gr. |
| CW50 |  | 0.425 | .85 | 1.275 | .425 |
| dPP |  |  |  |  | .425 |
| L5000/CW/dPP | 100/0/0 | 90/10/0 | 80/20/0 | 70/30/0 | 80/10/10 |

Figure 3:
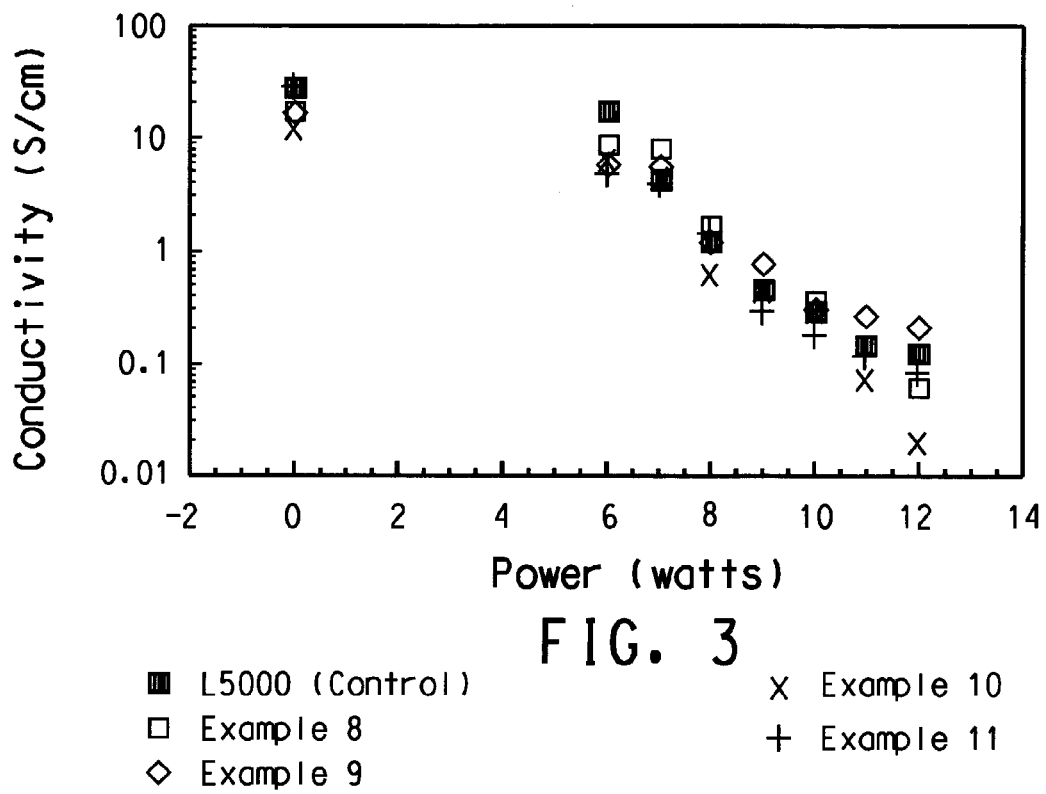
FIG. 3 shows the conductivity of the transferred solid strips as a function of the laser power.

The conductivity of the transferred solid strips as a function of the laser transfer power is shown in FIG. 3.

A minimum average laser power of 7 Watts was required to obtain adequate transferred layer adhesion and resolution. As shown in FIG. 3, the conductivity is slightly reduced as the CW50 concentration reaches 30%. The adhesion of the transferred films in Ex. 10 and Ex. 11 on to the receiver was excellent. However, Example 11 with only slightly less adhesion than Ex. 10 exhibited conductivity larger than 1 S/cm. This value is sufficient for electronic applications such as sources and drains in plastic transistors. Example 11 is a preferred embodiment of this invention

EXAMPLES 12-17

These examples illustrate the effect of added plasticizers on the adhesion and conductivity of a transfer polyaniline layer. The procedure for obtaining the donor layer is as previously described in Examples 1-3 with excess DNNSA addition omitted. Instead dPP or di-butyl phthlate (dBP) was added to the L5000 solution as described in Table 3 prior to coating on the donor element. The receiver layer, mounting procedure, imaging procedure and conductivity measurements were also as previously described for Examples 1-3.

TABLE 3

|  | control | Ex 12 | Ex 13 | Ex 14 | Ex 15 | Ex 16 | Ex 17 |
|---|---|---|---|---|---|---|---|
| L5000 (8.5%) | 50 gr. | 45 gr. | 40 gr. | 35 | 45 gr. | 40 gr. | 35 gr. |
| dBP |  |  |  |  | 0.425 | 0.85 | 1.275 |
| dPP |  | 0.425 | 0.85 | 1.275 |  |  |  |
| L5000/dBP/dPP | 100/0/0 | 90/0/10 | 80/0/20 | 70/0/30 | 90/10/0 | 80/20/0 | 70/30/0 |

Figure 4:
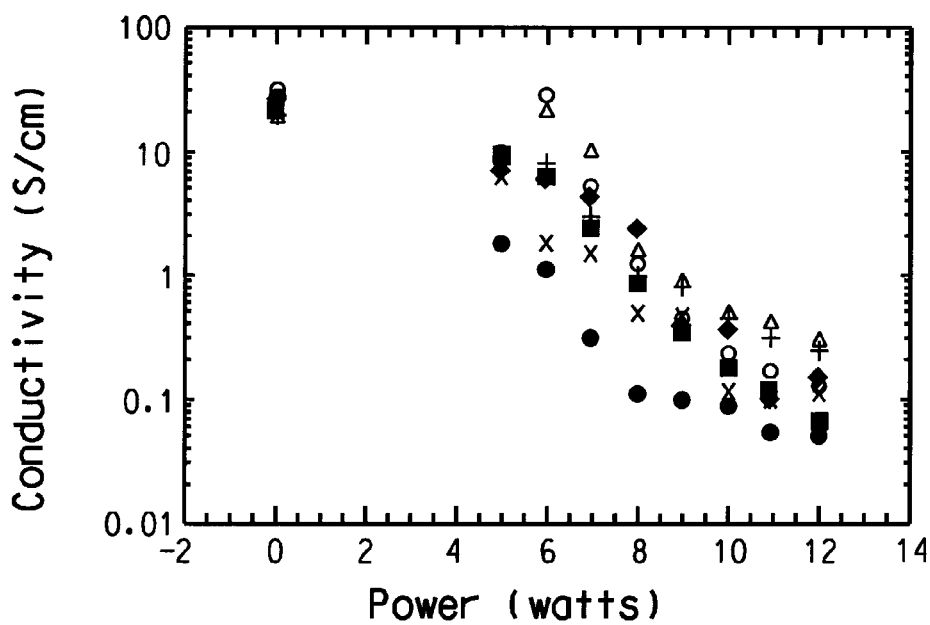
FIG. 4 shows conductivity (S/cm) versus laser power (watts) for Examples 12-17.

A average laser power of about 7 Watts at 150 RPM on drum revolution speed is required to transfer the layer with adequate adhesion and resolution. As shown in FIG. 4, the conductivity is significantly reduced when dBP concentration reaches 30%. In contrast, similar concentrations of dPP result in sufficient adhesion without degradation of the conductivity. The adhesion of the transferred films in Example 14 as well as the resulting conductivity was sufficient for electronic applications such as sources and drains in plastic transistors. Example 14 is a preferred embodiment of this invention.

EXAMPLES 18-21

These examples illustrate the effect of adding high decomposition temperature polymers as binders to polyaniline transferred layers. The procedure for obtaining the donor layer is as previously described in Examples 1-3 with DNNSA omitted. Instead, polystrene methyl methacrylate (PSMMA) or Elvaloy® 441 (hereafter HP441) were added to the L5000 solution prior to coating on the donor element. The receiver layer, mounting procedure, imaging procedure and conductivity measurements were also as previously described for Examples 1-3. The polystyrene methyl methacrylate (PSMMA) was obtained from Polyscience and the Elvaloy 441 is a copolymer of ethylene/n-butyl acrylate/carbon monoxide from DuPont, Wilmington Del.

TABLE 4

|  | Control | Ex. 18 | Ex. 19 |
|---|---|---|---|
| L5000 (8.5%) | 50 gr. | 40 gr. | 40 gr. |
| PSMMA |  |  | 0.85 |
| HP 441 |  | 0.85 |  |
| L5000/HP441/PSMMA | 100/0/0 | 80/0/20 | 80/20/0 |

Figure 5:
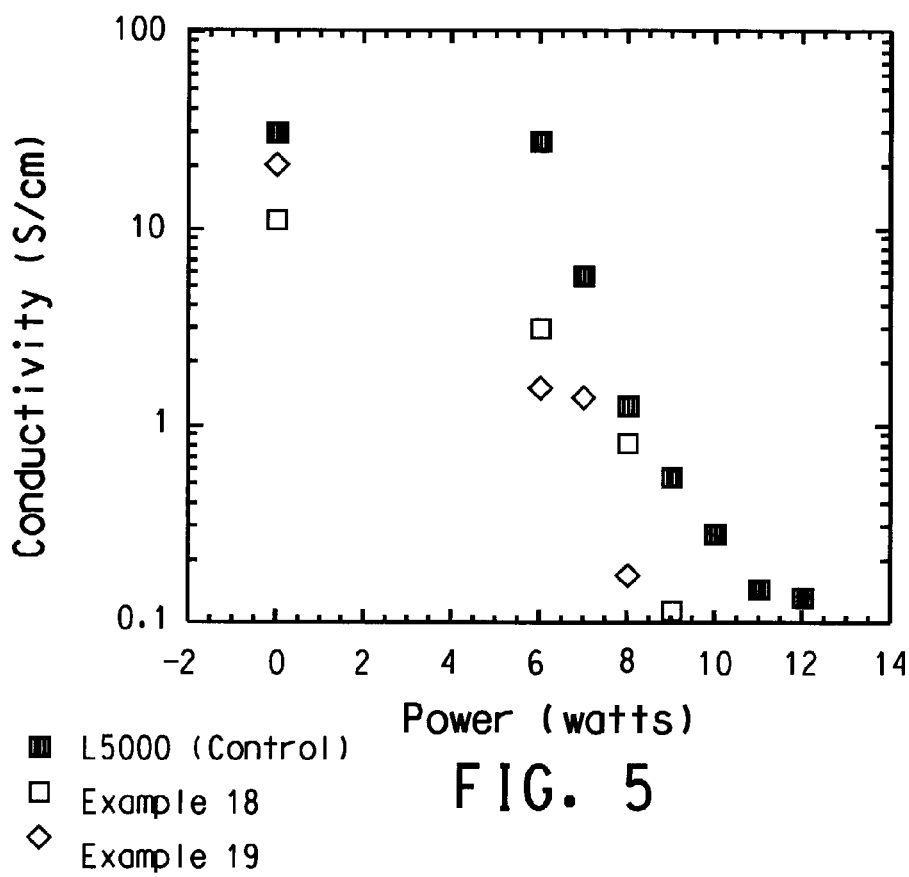
FIG. 5 shows the conductivity of transfer solid strips (S/cm) as a function of the laser power.

The conductivity of the solid strips as a function of the laser transfer power is shown in FIG. 5.

An average laser power of about 7 Watts at 150 RPM of drum revolution speed is required to obtain adequate adhesion and resolution in the transferred layer. As shown in FIG. 5, the conductivity is reduced below 1 S/cm at higher laser powers. In order to obtain adequate adhesion and high resolution imaging for material represented by Examples 18 and 19, a plasticizer should be added in addition to the binders described.

Figure 6:
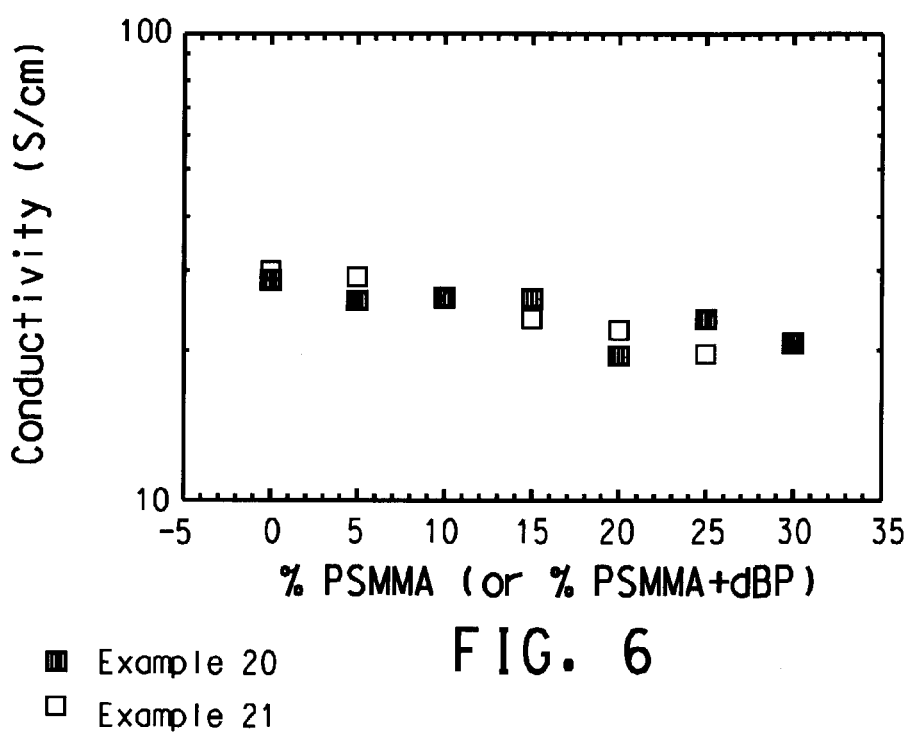
FIG. 6 shows the effect of the addition of PSMMA (Example 20) and PSMMA with 5% BP to L5000 on the conductivity of the untransferred material.

FIG. 6 shows the effect of addition of PSMMA (Example 20) and PSMMA with 5% dBP (Example 21) to L5000 on the conductivity of the untransferred material. The films that were made were measured using a four point probe measurement. The conductivity changes very slightly with considerable amounts of PSMMA and PSMMA with 5% dBP. The conductivity of the same films measured after laser transfer decreases rapidly as a function of the laser power used in the transfer process. Despite the decrease, the conductivity is adequate for use in electronics.

EXAMPLES 22-33

These examples show the effect of the addition of carbon nanotubes and excess DNNSA on laser transferred films of PANI. Addition of DNNSA is believed to increase the film adhesion to the receiver while the addition of carbon nanotubes increases the conductivity.

In carbon nanotubes, the carbon atoms are bound together in a hexagonal pattern to form long cylinders 1.2 nm in diameter. Nanotubes can also be formed with multiple layers of walls. They have good thermal and electrical conductivity. The nanotubes used in Examples 22 to 33 were manufactured by Rice University, Houston, Tex., U.S.A. via pulsed laser vaporization of a metal/carbon target in a furnace at 1100° C. This produces a sooty material, which is about 50% single-walled nanotubes. The rest of the material is amorphous carbon and residual catalyst particles. The main impurity is leftover Ni/Co catalyst particles. Most tubes are between 0.2 and 2 microns in length The polyaniline (PANI) used was prepared through emulsion polymerization following the procedure outlined in P. J. Kinlen, U.S. Pat. No. 5,863,465. Dinonylnaphthalene sulfonic acid (DNNSA) was used as the dopant. The resulting material is hereafter referred to as PANI-DNNSA. The addition of DNNSA was controlled such that the moles of the sulfur atoms from the acid equals the moles of nitrogen atoms in the backbone of the PANI. This was confirmed by elemental analysis studies after washing, separating and drying of the resulting PANI-DNNSA.

The dispersion of carbon nanotubes in PANI-DNNSA was performed with an acoustic Dukane sonicator with a horn probe using the following procedure. For Example 22, 59 mg Rice Laser carbon nanotubes and 19.03 g xylenes were mixed in a 2 oz. bottle. The mix was dispersed for 10 minutes with the horn probe submerged in the mix at a depth such that a stable mixing vortex was observed. 5.90 g of PANI-DNNSA in xylenes solution with a 32.9% solid content was added to the mixture. The resulting mixture was dispersed for additional 5 minutes during which time the bottle was shaken two times in order to rinse the carbon nanotubes off the walls of the bottle. The resulting slurry at 8% total solids was then coated as a 1-micron film using a Meyer rod #10. The film contains 3% NT and 97% polyaniline after drying.

For Examples 23, 60 mg Rice Laser carbon nanotubes and 19.01 g xylenes were added to a 2 oz. bottle. The mix was dispersed for 10 minutes with the horn probe submerged in the mix to a depth such that a stable mixing vortex was observed. 5.90 g of PAni-DNNSA with 32.9% solid content were added to the mixture. The resulting mixture was dispersed for additional 5 minutes during which time the bottle was shaken two times in order to rinse the carbon nanotubes off the walls of the bottle. 0.48 g of Nacure 1051 (50% by weight DNNSA in 2-butoxyethanol from King Industries) was then added to the mixture and mixed by shaking for two minutes. The resulting slurry at 8% solids was then coated as a 1-micron film using a Meyer rod #10. The film after drying contains 3% NT and 97% polyaniline. There is a 15% excess of DNNSA. For Example 24, the same procedure as Example 23 was used although with a 0.78 g addition of Nacure. This results in a 25% excess of DNNSA. Table 5 summarizes the composition of these examples.

TABLE 5

| Example | Ex. 22 | Ex. 23 | Ex. 24 |
| --- | --- | --- | --- |
| PAni-DNNSA 101261-130 (g) | 5.90 | 5.90 | 5.90 |
| Carbon nanotube (mg) | 59 | 60 | 61 |
| Xylenes (g) | 19.03 | 19.01 | 18.99 |
| Nacure 1051 (g) | 0 | 0.48 | 0.78 |
| Excess DNNSA (%) | 0 | 15 | 25 |

Figure 7:
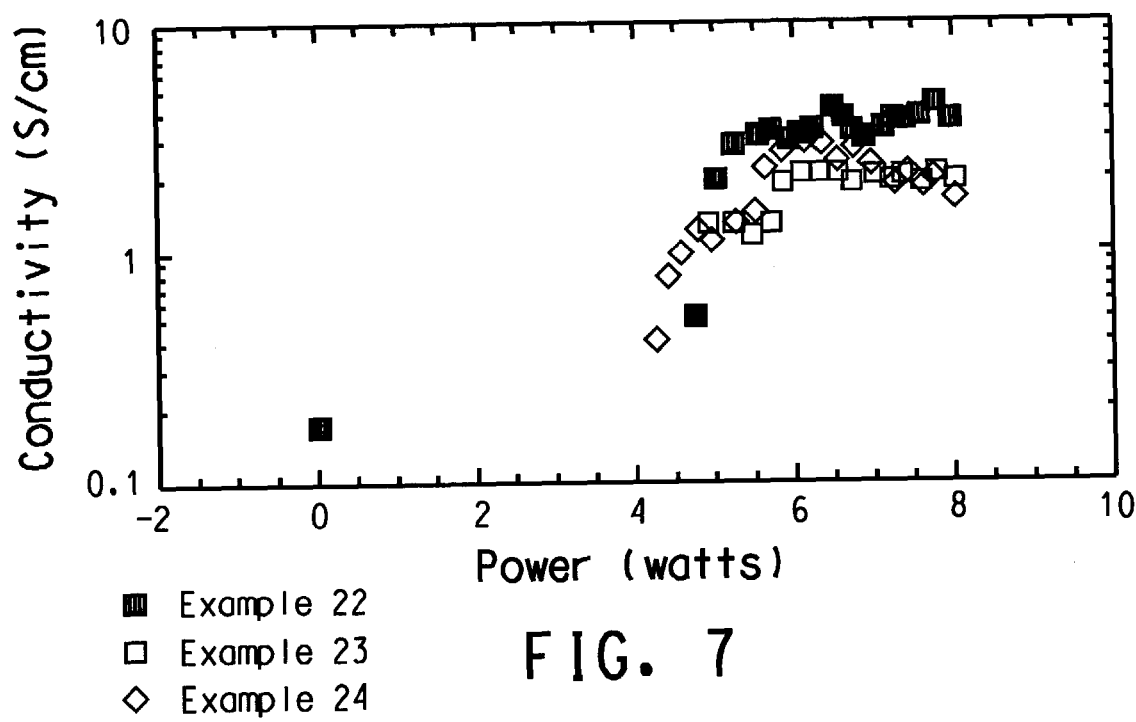
FIG. 7 shows the conductivity (S/cm) of solid transfer films as a function of laser power.
Figure 8:
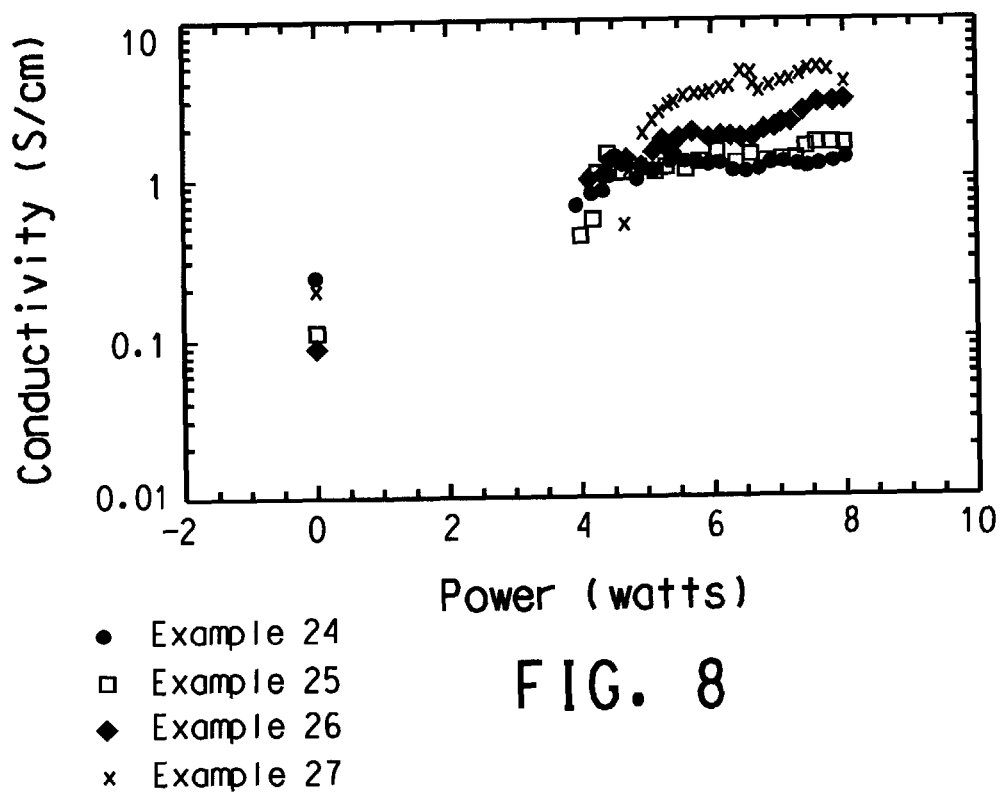
FIG. 8 shows conductivity (S/cm) versus laser power (watts) for Examples 24-27.

FIG. 7 below shows the conductivity of solid transfer films as a function of laser power. The imaging and conductivity measurements were performed as described Examples 1-3. The adhesion of the materials in Examples 23 and 24 is adequate. As seen in FIG. 7, the conductivity of the transferred film is adequate for average laser power above about 5 watts. Example 24 is a preferred embodiment of this invention.

Examples 25 to 27 demonstrate the effect of addition of carbon nanotubes on the conductivity of PANI-DNNSA without excess acid. For Examples 25, 26, and 27, the same procedure was followed as outlined for Example 22. This resulted in films with 1, 2, and 3% by weight carbon nanotubes, respectively. Table 6 summarizes the compositions of these examples.

TABLE 6

| Example | Ex. 25 | Ex. 26 | Ex. 27 |
| --- | --- | --- | --- |
| PANI-DNNSA | 9.01 | 6.72 | 5.90 |
| Carbon nanotube (mg) | 33 | 45 | 59 |
| Xylenes (g) | 15.94 | 18.26 | 19.03 |

The carbon nanotube/PANI-DNNSA solutions at 0, 1, 2 and 3% by weight carbon nanotubes concentrations were coated onto the Ni base previously described using a #10 Meyer rod and imaged using the CREO following the procedure described in Example 1.

When the adhesion and conductivity of the transfer film is balanced high-resolution images can be obtained. The films of Examples 24 through 27 all exhibit adequate conductivity, adhesion and resolution. Example 27 is a preferred embodiment of this invention.

Figure 9:
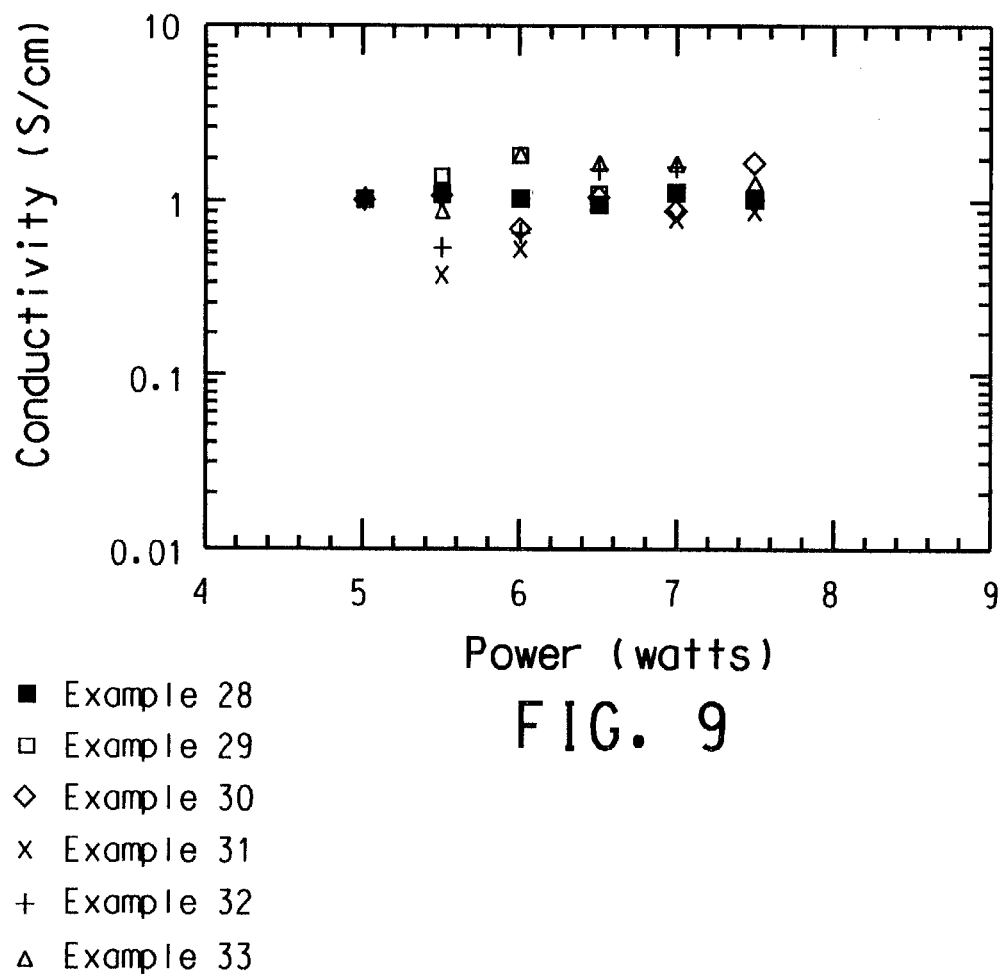
FIG. 9 shows that while excess acid improved adhesion of the transfer material to the receiver, the conductivity was frequently decreased.

The transfer of the conducting transfer layer by thermal imaging allows for very accurate control of line widths and channel widths. FIG. 9 shows the conductivity of 100 microns wide lines, 1250 microns in length. The sets of 15 lines were measured using a 4-probe technique as well. The contacts as well as the lines were imaged directly into a pattern suitable for a 4-probe measurement. The voltage and current to the contact lines were applied under the microscope using mini-manipulators with needle tungsten probes that could be exactly positioned on the line at the end. The patterns were transferred at specific laser powers and their conductivity measured.

The materials in Examples 28, 29 and 30 correspond to the materials used to Examples 25, 26, and 27. Examples 31, 32 and 33 were dispersed using the same procedure as Example 24. Examples 31, 32 and 33 all have 25% excess acid, but the carbon nanotube concentrations are 1, 2, and 3% by weight, respectively. Table 7 summarizes the composition of the materials.

TABLE 7

| Example | Ex. 31 | Ex. 32 | Ex. 33 |
| --- | --- | --- | --- |
| PAni-DNNSA | 9.00 | 6.70 | 5.90 |
| Carbon nanotube (mg) | 30 | 44 | 61 |
| Xylenes (g) | 15.98 | 18.25 | 18.99 |
| Nacure 1051 (g) | 1.19 | 0.89 | 0.78 |
| Excess DNNSA (%) | 25 | 25 | 25 |

FIG. 9 shows that while excess acid improved the adhesion of the transfer material to the receiver, the conductivity was frequently decreased. The conductivity generally increases with increasing carbon nanotube concentration. However, the addition of the carbon nanotubes tends to decrease the adhesion of the film, counteracting to some degree the addition of the acid. In order to obtain a transferred film with appropriate adhesion and conductivity, the ratio of acid and carbon nanotubes must be balanced. Example 33 with 3% nanotubes and 25% excess DNNSA is best mode of this invention, representing the desired balance.

EXAMPLE 34

This example shows the effect of a dispersion of Hipco carbon nanotubes on laser transferred films of PANI with DNNSA. The Hipco NT is from Rice University, Houston, Tex., U.S.A. The Hipco carbon nanotubes have similar properties to other, previously-described Rice University nanotubes although it is believed that Hipco nanotubes have a concentration of single wall nanotubes of approximately 50%. The PANI used was prepared in the same way as in Example 22 with Dinonylnaphthalene sulfonic acid used as a doping acid. This is referred to as PANI-DNNSA.

The dispersion of Hipco carbon nanotubes in PANI-DNNSA was performed with a Branson bath sonicator followed by an acoustic Dukane sonicator with a horn probe using the following procedure. For Example 34, 45 mg Rice Hipco carbon nanotubes, 20.10 g xylenes and 4.86 g PANI- DNNSA (29.95% solids) in xylenes were mixed in a 2 oz. bottle. The mix was then placed in the Branson bath sonicator for 60 minutes, during which time the bottle was shaken for 1 minute in every 15 minute interval. The resulting mix was then dispersed for an additional 3 minutes with the horn sonicator during which time the bottle was shaken for 30 seconds in every 1 minute interval in order to rinse the carbon nanotubes off the walls of the bottle. 2.5 μL Zonyl FSO surfactant was then added to the resulting slurry which contained 6% total solids. The Hipco carbon nanotube-PANI-DNNSA was then coated onto a previously-described nickel substrate using a #10 Meyer rod and imaged using the CREO following the procedure described in Example 1. The film contains 3% NT and 97% polyaniline after drying. Table 8 summarizes the composition of the dispersion in this example.

TABLE 8

| Example | Example 34 |
|---|---|
| PAni-DNNSA (E103330-107, g) | 4.86 |
| Hipco Carbon nanotube (mg) | 45 |
| Xylenes (g) | 20.10 |

Figure 10:
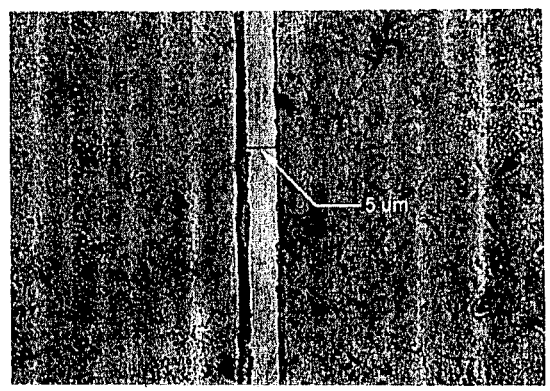
FIG. 10 shows source and drain lines of conductor with a 5 micron channel.

To illustrate the very high resolution and suitable conductivity achievable with the formulation described, source and drain lines with a 5 micron (1 pixel) channel (shown in FIG. 10) and a 10 micron line serpentine pattern (shown in FIG. 11) were printed. The material's use in functioning electronic circuits was also illustrated by printing sources and drains and gate layers of an inverter circuit via thermal imaging. The images were obtained using a CREO trendsetter with 5080 DPI (CREO-Scitex, Vancouver, Canada). A Spectrum Trendsetter Exposure Unit, available from Creo Inc. (Vancouver, Canada) exposed the donor elements. The laser power for the exposure of the 5 micron channel. (FIG. 10), the serpentine pattern (FIG. 11) and gate and source/drain layer (FIG. 12) was 3.45 Watts. The printer drum speed was 100 RPM.

The receiver comprised a 5 micron Elvax extruded onto 400D Mylar (DuPont, Towanda, Pa.). The PANI/Hipco donor layer was loaded onto the receiver and the structures shown in FIGS. 10 and 11 were printed.

Figure 11:
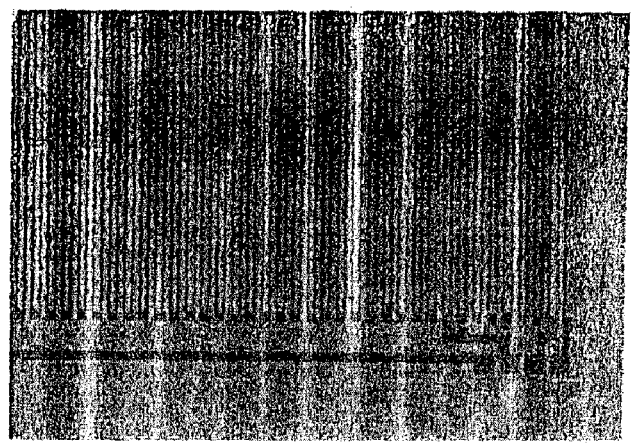
FIG. 11 shows a 10 micron line serpentine pattern.
Figure 12:
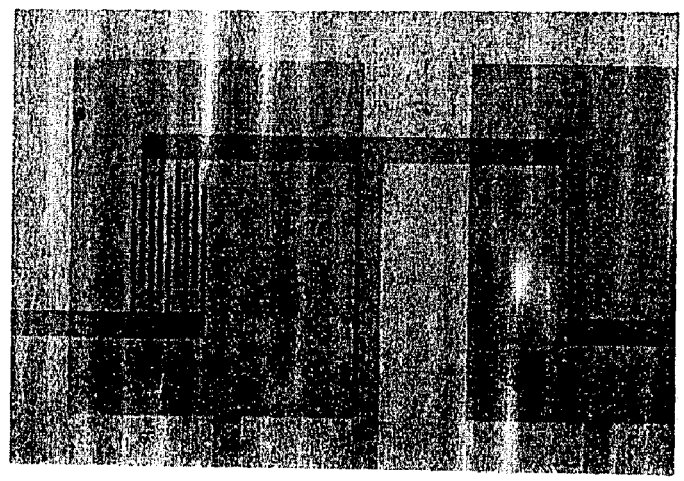
FIG. 12 shows an inverter device.

The conductivity of the 10 microns lines shown in FIG. 11 is 800 ohms-square and the film thickness was about 1 micron. The Inverter in FIG. 12 is formed in the following fashion. First, the gate layer is printed with a donor as described above. After the printing of this layer is completed, the receiver is removed from the equipment and a strip of dielectric is laminated across the gate without covering the gate electrodes at the contact locations. After lamination, the receiver is re-position for printing of the source and drain. The receiver is then removed and Pentacene is evaporated onto the inverter transistors. As shown in FIG. 12, the transfer of the conducting lines using the PANI/Hipco composition exhibits very high resolution with very accurate control of line widths and channel widths. The channel lengths for the five transistors on the left and single transistor on the right are 30 micron.

Figure 13:
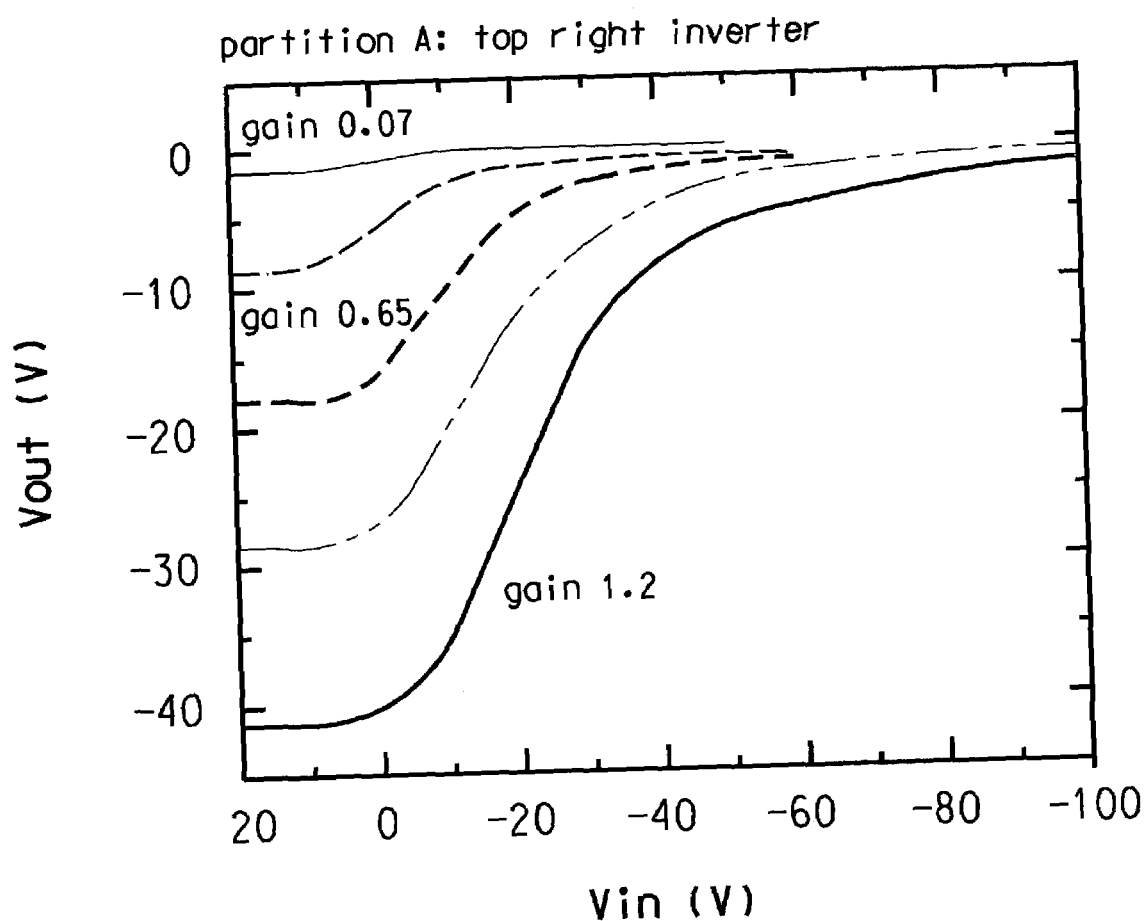
FIG. 13 shows the electrical characteristics of the inverter device.
Figure 14:
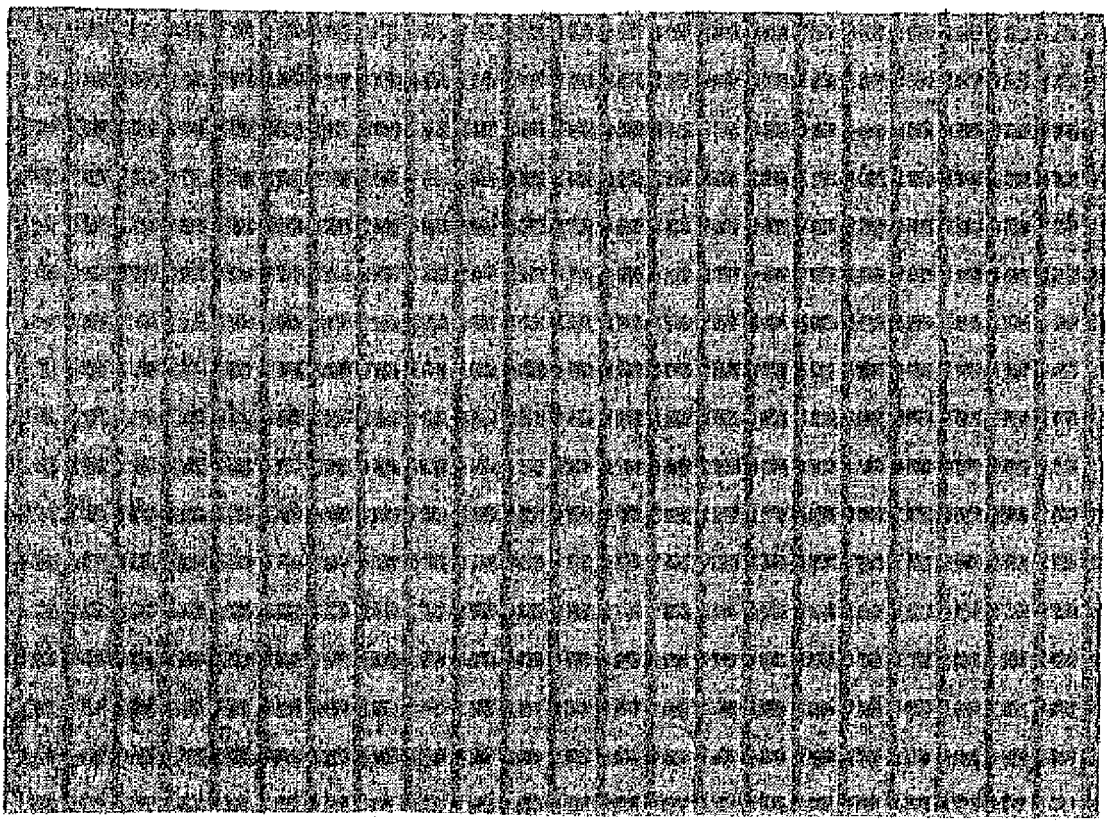
FIG. 14 shows a backplane of an electrophoretic display.

The electrical characteristics of an operating inverter are presented in FIG. 13. The printed inverter shows a gain of 1.2, quite adequate for electronic applications. The adhesion of the materials in Examples 34 is adequate. Example 34 is a preferred embodiment of this invention. FIG. 14 shows a backplane of an electophoretic display of the imaged conductor of Example 34.

What is claimed is:

1. A composition comprising:
   a) polyaniline doped with dinonylnaphthalene sulfonic acid
   dinonylnaphthalene sulfonic acid such that there are from 0.15 to 1 additional molecules of the excess dinonylnaphthalene sulfonic acid for each nitrogen in the polymer; and
   c) carbon nanotubes.

2. The composition of claim 1 wherein the carbon nanotubes are single wall carbon nanotubes.

3. The composition of claim 1 wherein the carbon nanotubes are multi-wall carbon nanotubes.

4. The composition of claim 1 wherein the carbon nanotubes are laser-grown carbon nanotubes.

5. The composition of claim 1 further comprising surfactant at a concentration of 0.005 to 0.05% by weight.

6. The composition of claim 5 further comprising a second macromolecule at a concentration of 1 to 30% by weight.

7. The composition of claim 1 further comprising a second macromolecule at a concentration of 1 to 30% by weight.

8. A process comprising
   patterning a layer of the composition of claim 1 with an image transfer or printing process.

9. An electronic device comprising a patterned conductor comprising the composition of claim 1.

10. The electronic device of claim 9 wherein the device is selected from the group consisting of: an interconnect, a transistor, a source and drain electrode pair, a gate electrode.

* * * * *